United States Patent [19]
Ludford, III

[11] Patent Number: 5,922,406
[45] Date of Patent: Jul. 13, 1999

[54] COATING METHOD AND APPARATUS

[76] Inventor: Robert E. Ludford, III, 450 Windy Point Dr., Glendale Heights, Ill. 60139

[21] Appl. No.: 08/947,487

[22] Filed: Oct. 10, 1997

Related U.S. Application Data

[60] Provisional application No. 60/028,361, Oct. 11, 1996.

[51] Int. Cl.$^6$ ........................................................ B05D 1/00
[52] U.S. Cl. .......................... 427/287; 427/428; 118/211; 118/212; 118/249; 118/262; 118/46; 118/DIG. 15; 101/415.1
[58] Field of Search ..................... 118/211, 212, 118/249, 262, 46, DIG. 15; 101/415.1; 427/287, 428

[56] References Cited

U.S. PATENT DOCUMENTS

| | | |
|---|---|---|
| 1,698,747 | 1/1929 | Wagner et al. . |
| 1,848,856 | 3/1932 | Wagner et al. . |
| 2,623,495 | 12/1952 | Johnson . |
| 2,820,409 | 1/1958 | Johnson . |
| 3,203,346 | 8/1965 | Norton et al. . |
| 3,229,625 | 1/1966 | Pannier . |
| 3,268,982 | 8/1966 | Schutze .................................... 118/212 |
| 3,391,673 | 7/1968 | Knapp et al. ............................ 118/212 |
| 3,419,418 | 12/1968 | Gamble . |
| 3,557,695 | 1/1971 | Preuss .................................. 101/415.1 |
| 3,903,796 | 9/1975 | Jeschke et al. ........................ 101/415.1 |
| 4,006,686 | 2/1977 | Ackerman .............................. 101/415.1 |
| 4,193,178 | 3/1980 | McArthur et al. ....................... 29/129.5 |
| 4,688,484 | 8/1987 | Herold et al. .......................... 101/415.1 |
| 4,759,287 | 7/1988 | Shizuya .................................... 101/248 |
| 4,813,356 | 3/1989 | Abendroth et al. .................. 101/415.1 |
| 4,977,833 | 12/1990 | Inage et al. ........................... 101/415.1 |
| 5,052,299 | 10/1991 | Kojima .................................. 101/415.1 |
| 5,272,978 | 12/1993 | Wehle et al. .......................... 101/415.1 |
| 5,714,197 | 2/1998 | Suzuki et al. ............................. 427/287 |

*Primary Examiner*—Laura Edwards
*Attorney, Agent, or Firm*—Andrew R. Basile

[57] ABSTRACT

A coating applicator is provided having a plate cylinder including a cylindrical body about which a coating plate is mounted in sleeve-like fashion. The plate is the type used in the flexographic printing industry, and is made of photosensitive, monomeric material. The longitudinal edges of the plate are mounted to the cylindrical body using a clamping mechanism which permits easy installation and removal. Even with relatively light pressure, the photopolymer plate releases a substantial portion of the coating material when the plate is applied to a workpiece. Consequently, the composition and secondary rollers may be spaced apart by a gap slightly smaller than the thickness of the workpiece. Because of this gap, coating material does not tend to be applied from the plate cylinder to the secondary roller, thus reducing the safety and environmental problems associated with cleaning the secondary roller.

16 Claims, 4 Drawing Sheets

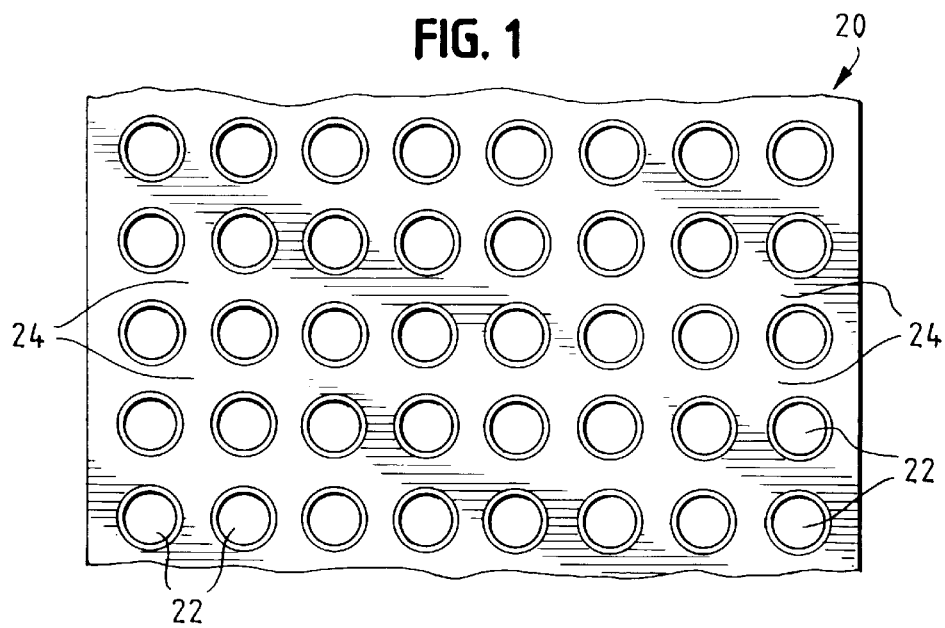
FIG. 1
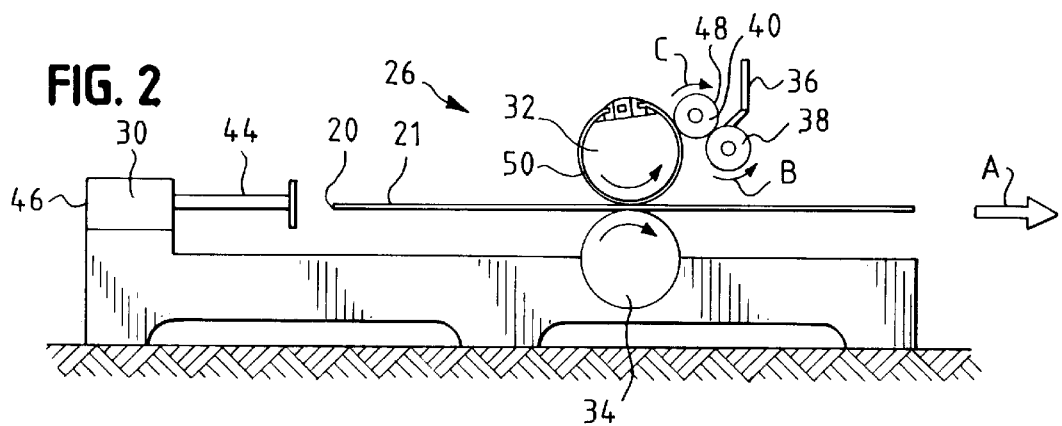
FIG. 2
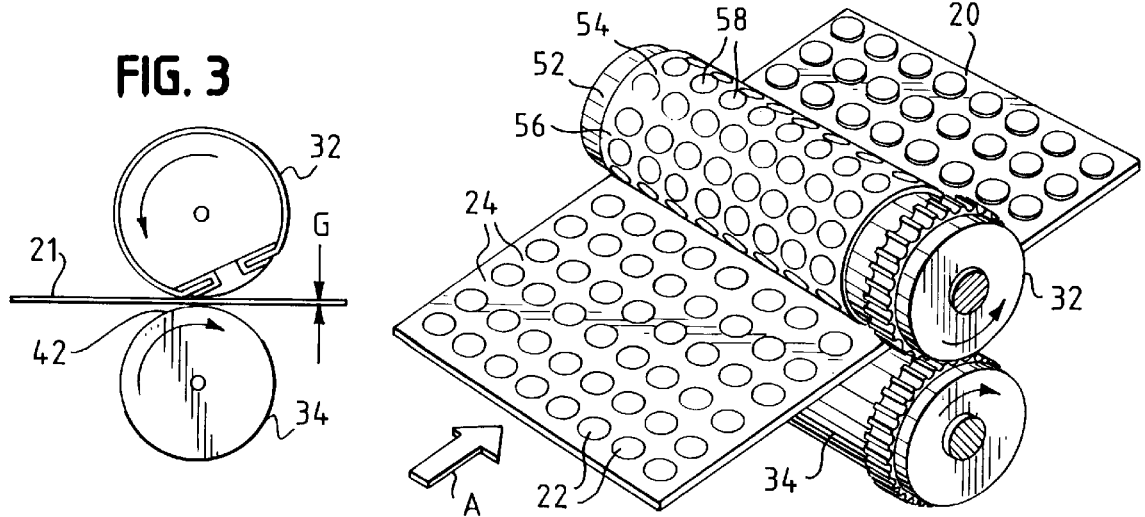
FIG. 3
FIG. 4

FIG. 9
FIG. 10
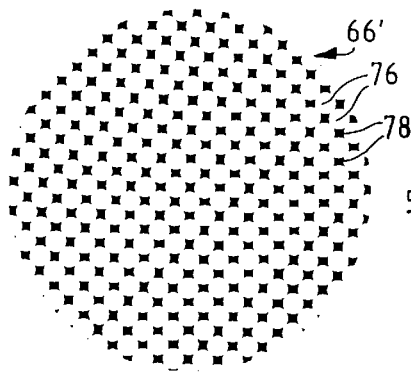
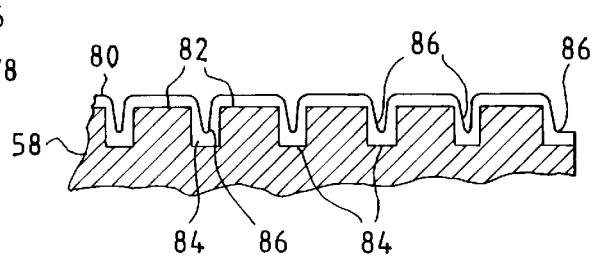
FIG. 11
FIG. 12
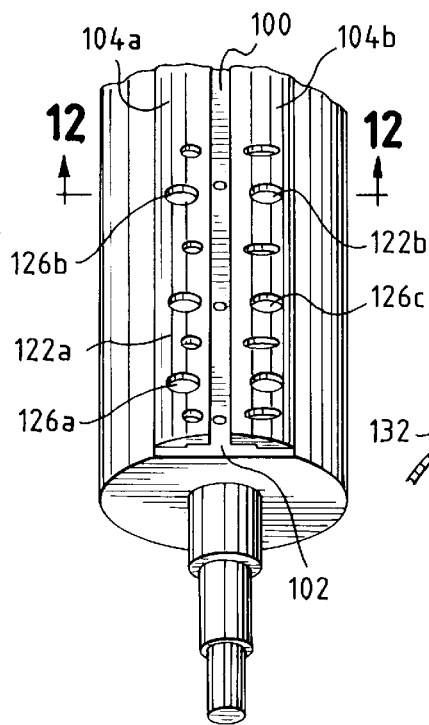
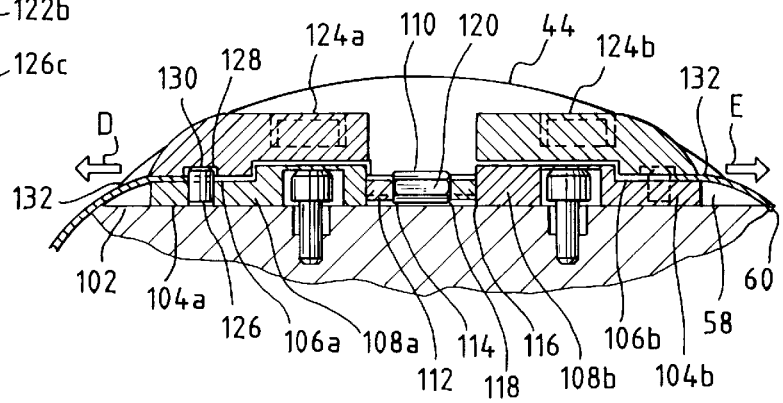
FIG. 13
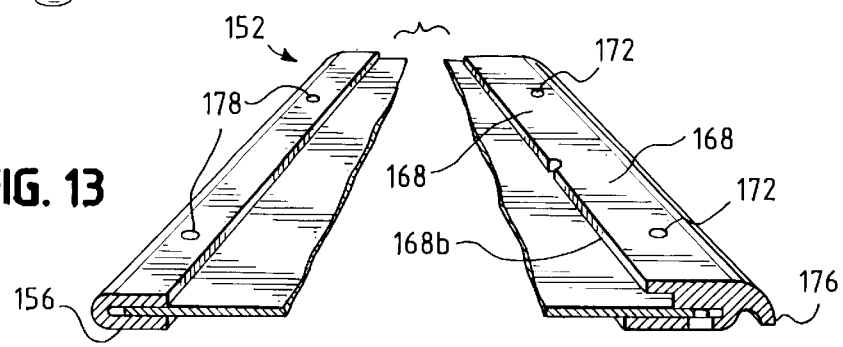

COATING METHOD AND APPARATUS

RELATED APPLICATION

This application is based upon the present inventor's provisional U.S. patent application Ser. No. 60/028,361 filed Oct. 11, 1996 and entitled "Coating Method and Apparatus," the disclosure of which is hereby incorporated by reference in its entirety.

FIELD OF THE INVENTION

The invention relates to metal coating generally, and in particular, to techniques for selectively applying coating in a desired thickness and/or location.

BACKGROUND

The field of metal coating concerns processes of applying a protective, decorating, or other type of coating to metal, especially sheet metal. For example, referring to FIG. 1, a sheet 20 of metal may be used to form metal products such as can ends and bottle caps. Coating material, such as gold sanitary enamel is applied to the planar face 21 of sheet metal 20 for hygienic or aesthetic reasons. If one peers inside an aluminum beverage can, for example, one can see the sheen of this type of coating material. As shown in FIG. 1, sheet metal 20 is stamped into desired articles 22 (in this case, can ends). This results in a pattern of waste or scrap areas 24 between the desired articles 22. Because coating is expensive, it is desirable to avoid coating scrap areas 24. Other areas where coating is not desired may exist, for example, at portions of sheet metal 20 that are intended to become can seams.

The metal decorating industry has tried for many years to avoid coating scrap and other areas. A typical coating device used to achieve this objective includes a composition roller, a scrapper or chill roller, a fountain roller, and a distributor roller. These rollers are rotably mounted in parallel, adjacent relation, with the fountain roller engaging the distributor roller, and the distributor roller engaging the composition roller. A material feed supplies coating material to the fountain roller. As the rollers rotate, coating material is applied in sequence from the fountain roller to the distributor roller, and then to the engaging the composition roller. A material feed supplies coating material to the fountain roller. As the rollers rotate, coating material is applied in sequence from the fountain roller to the distributor roller, and then to the composition roller. Sheet metal 20 is fed between the composition roller and the scrapple roller by a conveying mechanism. It is the composition roller that actually applies the coating to sheet metal 20.

In accordance with an existing technique, sections are engraved out of the composition roller in a pattern corresponding to the pattern of scrap areas 24. The portions of the composition roller which are engraved carry no coating material, and, therefore apply no coating to the scrap areas 24 of sheet metal 20.

The existing technique has a number of drawbacks. Engraving cut-out sections in the composition roller is a time consuming and costly process. Because the cut-out sections are engraved onto a cylindrical roller (as opposed to a flat surface), accurate cuts are difficult to obtain and many rollers are spoiled in the attempt.

To ease the engraving process, rubber rollers have been used, but materials like rubber wear poorly. Further, the composition roller must be changed each time a new job is run through the coating apparatus. This, too, is a labor intensive process. Another drawback with using rubber rollers is that rubber tends to retain the coating material. This requires the composition roller to be applied to sheet metal 20 with high pressure. To provide sufficient pressure, the rubber composition roller is in direct contact with the scrapple roller. As sheet metal 20 is sandwiched between the composition roller and the scrapple roller, the thickness of sheet metal 20 causes the rubber composition roller to be compressed against the face of sheet metal 20, thus providing the pressure required to release the coating material from the composition roller. Once sheet metal 20 has passed through the coating apparatus, the composition roller directly contacts the scrapple roller. As a result, coating material is transferred from the composition roller to the scrapple roller. This is undesirable, and requires labor-intensive cleaning to remove the coating material from the scrapple roller. In addition, the agents used to clean the scrapple roller include solvents which raise issues of occupational safety and environmental pollution. Ideally, a composition roller would not require substantial pressure to impart coating to sheet metal 20, and therefore would not be in direct contact with the scrapple rollers.

SUMMARY OF THE INVENTION

To overcome the drawbacks of the prior art, a coating applicator is provided having a plate cylinder including a cylindrical body about which a coating plate is mounted in sleeve-like fashion. The plate is the type used in the flexographic printing industry, and is made of photosensitive, monomeric material. The longitudinal edges of the plate are mounted to the cylindrical body using a clamping mechanism which permits easy installation and removal.

The plate may contain a plurality of raised cells, which correspond to those areas of the workpiece for which coating is desired. The cells may be imposed on the plate using a photographic process. For greater levels of coating, the cells may include screen pattern areas comprising small grid-like wells. The wells of these screen pattern areas provide recesses in which extra coating can be carried, resulting in thicker coating layers being applied to selected portions of the workpiece.

The placement and shapes of the cells and screen patterns are generated by computer graphics or hand-drawn artwork, from which a photographic film can be made. This allows a complexity of design which is not possible when non-image sections must be engraved out of a composition roller.

Even with relatively light pressure, the photopolymer plate releases a substantial portion of the coating material when the plate is applied to a workpiece. Consequently, the composition and secondary rollers may be spaced apart by a gap slightly smaller than the thickness of the workpiece. Because of this gap, coating material does not tend to be applied from the plate cylinder to the secondary roller, thus reducing the safety and environmental problems associated with cleaning the secondary roller.

BRIEF DESCRIPTION OF THE DRAWINGS

FIG. 1 is a top plan view of a sheet metal workpiece.

FIG. 2 is an idealized side elevation view of a coating applicator in accordance with an embodiment of the invention.

FIG. 3 is an enlarged idealized partial side elevation view of the coating applicator of FIG. 2.

FIG. 4 is an idealized perspective view of a plate cylinder used in the embodiment of FIG. 2.

FIG. 9 is an enlarged, partial top view of the film shown in FIG. 6.

FIG. 10 is an enlargement of the sectional view of FIG. 8, showing, in addition, ink applied to the surface of a screened one of the image cells.

FIG. 11 is a perspective view of the plate cylinder used in the applicator of FIG. 2, showing a clamping mechanism for attaching the plate to the plate cylinder in accordance with a first embodiment of the invention.

FIG. 12 is a sectional view of the plate cylinder shown in FIG. 11 taken along the line 12—12.

FIG. 13 is a partial perspective view of a sprinting plate used with a second embodiment of the clamping mechanism.

DETAILED DESCRIPTION OF THE PREFERRED EMBODIMENT

Figure 5:
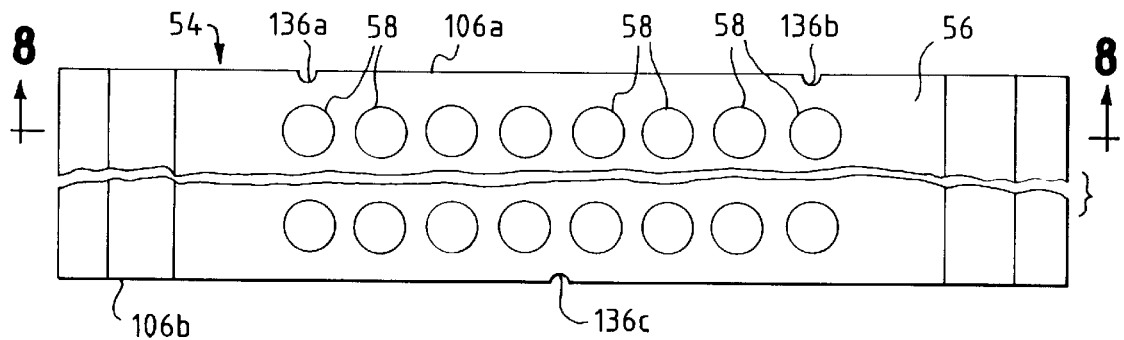
FIG. 5 is a top plan view of the plate used in plate cylinder of FIG. 4, shown in a flat position.

FIG. 2 shows a front elevation of a coating applicator 26 in accordance with the invention. Applicator 26 includes a frame 28 upon which is mounted a a conveyor-feeder mechanism 30, which conveys a sheet metal workpiece (such as sheet metal 20) in the direction shown by arrow A between a plate cylinder 32 and an adjacent secondary roller 34. As explained below, plate cylinder 32 selectively applies coating material to sheet metal workpiece 20 in varying thickness so that areas 24 of sheet metal 20 which are destined to be scrap receive little or no coating, and the areas 22 of sheet metal 20 which will be incorporated in an end product receive more coating.

Applicator 26 also includes a feeder 36, a metering roller 38, and an analox roller 40. Coating material is dispensed through feeder 36 to metering roller 38. Metering roller 38 is parallel and adjacent to analox roller 40. Rollers 38 and 40 are rotated by a drive (not illustrated) about their respective longitudinal axes in opposite directions shown by arrows B and C, respectively, so that they are rollingly engaged to transfer coating material from metering roller 38 to analox roller 40.

Likewise, analox roller 40 is parallel and adjacent to plate cylinder 32, which is rotated in the opposite direction as analox roller 40. The peripheral cylindrical surface 48 of analox roller 40 just touches the peripheral cylindrical surface 50 of plate cylinder 32 so that cylinder 32 and roller 40 engage with minimal compressive force sufficient to transfer coating material from analox roller 40 to plate cylinder 32. Suitable compressive force is 2000 pounds per square inch.

Referring to FIG. 3, an enlarged side view of plate cylinder 32 and secondary roller 34 is provided. A gap 42 of approximately 0.25 inches exists between cylinder 32 and roller 34. This gap is slightly smaller than the thickness of sheet metal 20. Secondary roller 34 may be adjustably mounted for vertical movement relative to composition roller 32. This allows adjustment of gap 42 to accommodate sheet metal work pieces of various thickness. Because plate cylinder 32 is spaced-apart from secondary roller 34, coating material is not transferred from plate cylinder 32 to secondary roller 34.

As shown in FIG. 2, conveyer 30 includes a push bar 44 and an actuator 46, which causes push bar 44 to reciprocate in the same plane as occupied by sheet metal 20. Push bar 44 engages the tailing edge of sheet metal 20 to slide sheet metal 20 into gap 42 between plate cylinder 32 and secondary roller 34. Once the leading edge of sheet metal 20 is inserted into gap 42, the rotation of plate cylinder 32 and secondary roller 34 conveys sheet metal 20 along the direction indicated by arrow A. As sheet metal 20 is conveyed, coating resident on the peripheral surface 50 of plate cylinder 32 is transferred onto the upward facing planar face 21 of sheet metal 20. Gap 42 is sized slightly smaller than the thickness of sheet metal 20 to provide a slight compressive force between plate cylinder 32 and the upwardly facing planar face 21 of sheet metal 20.

FIG. 4 provides an idealized perspective view of plate cylinder 32. Plate cylinder 32 includes a metal or other rigid cylindrical body 52 and a flexible coating plate 54 mounted to body 52 in sleeve-like fashion. Referring to FIGS. 4 and 5, plate 54 is a flat, flexible strip of photosensitive polymer material which is wrapped around cylindrical body 52. The planar surface of plate 54 defines an image transfer surface 56. Plate 54 is mounted on to body 52 so that image transfer surface 56 is outward facing. When coating material is transferred from analox roller 40 to plate cylinder 32 (see FIG. 2 above), coating material is applied to the image transfer surface 56.

In this case, as best seen in FIG. 5, image transfer surface 56 contains a plurality of raised image cells 58, the construction of which is described below. Cells 58 are arranged to define a pattern corresponding to those areas 22 of sheet metal 20 where coating is to be applied. Recessed interstitial spaces 62 between cells 58 define a pattern corresponding to the scrap areas 24 and other areas of sheet metal 20 where coating is not desired. Interstitial spaces 62 do not receive coating from analox roller 40 because they are recessed relative to cells 58.

For clarity, only a few cells 58 are illustrated in FIG. 5. In practice, plate 54 may have more cells, such as suggested in the idealized perspective view of FIG. 4. Cells 58 may be sized and shaped to provide decorative as well as functional patterns of applied coating. Alternatively, a cell 58 can cover a substantial area of image transfer surface 56 so that a large area of sheet metal 20 will be coated, including both articles 22 and scrap areas 24. By applying at least some coating to scrap areas 24, sheet metal 20 is protected from rust and corrosion until such time as sheet metal 20 is stamped during production. When coating is applied to both articles 22 and scrap areas 24, a screening technique (discussed below) is used to vary coating levels between articles 22 and scrap areas 24.

Figure 6:
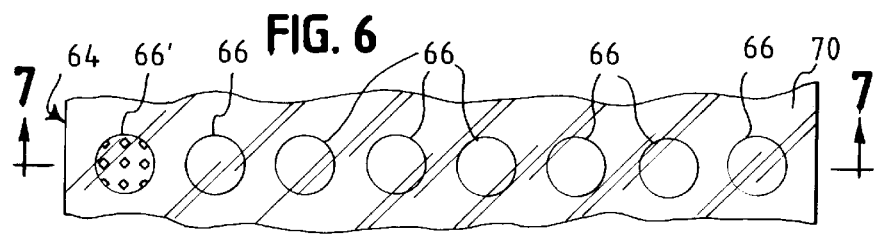
FIG. 6 is a top plan view of a film used to create coating cells on the plate shown in FIG. 5.

Referring to FIGS. 5 through 8, the construction and of cells 58 is illustrated. As explained above, plate 54 is made of photosensitive material, such as Cyrel™ manufactured by DuPont Corporation of Wilmington, Delaware. This material is used in the flexographic printing industry. Prior to formation of cells 58, plate 54 is flat, planar plastic approximately 0.1 inches thick composed of a photosensitive monomeric material, as shown in FIG. 5. Plate 54 is prepared using a photographic film 64 shown in FIG. 6. Film 64 is generally opaque but includes light-admitting areas 66 that define a pattern corresponding to the shape and placement of cells 58, respectively. For clarity, only a few light admitting areas 66 are shown in FIG. 6 to be consistent with the depiction of plate 54 in FIG. 5.

Figure 7:
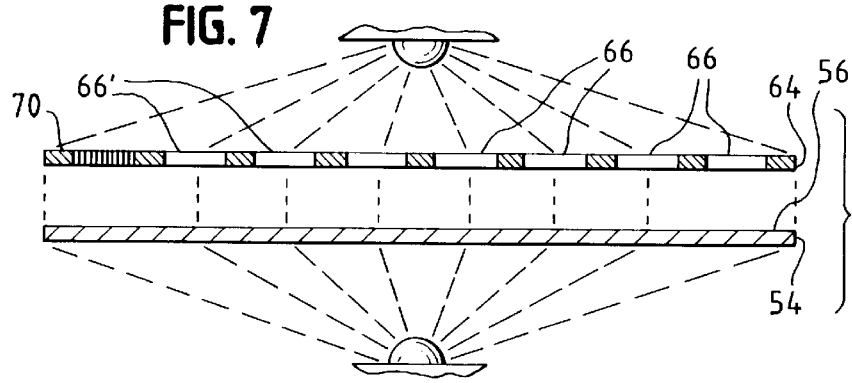
FIG. 7 is a cross-sectional view of the film shown in FIG. 6 taken along the line 7—7, along with a side view of an unfinished plate, illustrating the film superimposed on the unfinished plate during an exposure process.

To fabricate cells 58, film 64 is placed over the surface 56 of plate 54. During an exposure process, light L is cast through film 64, as shown in FIG. 7. Light L passes only through the light-admitting areas 66, so that only those portions 72 of plate surface 56 that are aligned with light-admitting elements 66 are struck by light. Although plate 54 and film 64 are shown spaced-apart in FIG. 7, in practice plate 54 and film 64 are in full planar contact during the exposure process.

Figure 8:
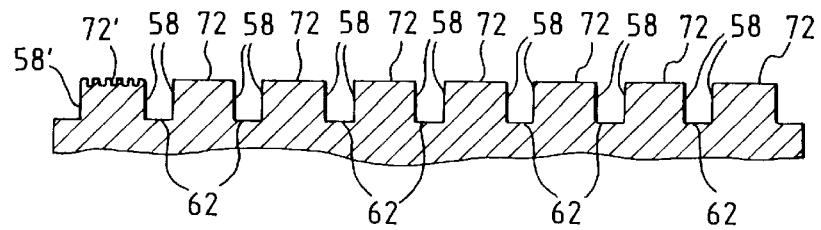
FIG. 8 is a cross-sectional view of the plate of FIG. 5 taken along the lines 8—8.

After the exposure process, a photochemical reaction (followed by chemical treatment) dissolves portions of surface 56 which are not aligned with light-admitting elements 66 of film 64, leaving in their place recessed interstitial portions 62, as shown in FIG. 8. Surface areas 72 of plate 54 where light L does strike are polymerize and are not dissolved by the chemical treatment. These polymerized areas form the raised cells 58 shown in FIGS. 4 and 8. The shape and location of areas 58 are determined by the pattern of light-admitting areas 66.

In accordance with another aspect of the invention, some image cells 58 may be constructed with a screen pattern (See FIGS. 5 and 8), which enables them to hold a varying amount of coating material. By using the screen pattern, it is possible to apply more or less coating to particular areas of sheet metal 20, such as, for example articles 22 and scrap areas 24.

To create a cell 58' having a screen pattern on its surface 72', film 64 includes a light-admitting area 66', which is shown in FIG. 6. Area 66' is identical to areas 66 of FIG. 6, except that superimposed on area 66' is a fine grid of light-admitting elements 76 spaced apart by opaque lines 78, as illustrated in FIG. 9. During the exposure process, portions of image transfer surface 56 that are aligned with the light-admitting elements 76 are exposed to light L. At the same time, portions of image transfer surface 56 that are aligned with opaque grid lines 78 are not exposed to light L. The result is a fine grid-like screen pattern on the surface 72' of raised cell 58'. As seen in FIG. 10, surface portions 82 aligned with light-admitting elements 76 are polymerized, and are not dissolved during chemical treatment. Contrastingly, portions 84 that are aligned with opaque grid lines 78 do not polymerize, and dissolved during chemical processing leaving behind a recessed well.

As shown in FIG. 10, coating material 80 applied to the surface 72' of cell 58' covers raised areas 82 and in addition flows into wells 84 to provide extra deposits 86 of coating material. Because cell 58' includes wells 84 containing deposits 86, Cell 58' holds a greater volume of coating material than a similarly sized and shaped cell 58 that does not have a screen pattern imposed thereon. This greater volume of coating depends on the granularity of the grid formed by elements 76 and lines 78. In effect, the presence of a screen pattern and its accompanying grid-like wells allows the amount of coating material contained by cell 58' to be selectively varied.

In developing the invention, it was initially thought that screened light-admitting areas such as 66' would result in corresponding areas of image transfer surface 56 that would transfer less coating. This the result one would expect based on the performance of flexographic materials in a traditional printing application. Through experimentation, however, it was realized that the exact opposite relationship existed when working with coating materials. Specifically, the grid-like pattern of area 66' creates screened areas such as illustrated in FIG. 11 that transfer greater amount of coating for a selected size cell such as cell 58'. It is believed that this results from the relatively lower viscosity of coating material (as compared to printing ink). This lower viscosity permits the extra volume of coating to flow into wells 84, where it is carried by plate 54 and ultimately transferred to the surface 21 of sheet metal 20.

Clamping Assembly

An important advantage of the invention is that plate cylinder 32 can be adopted for various production runs by simply installing different plates 54. Cylindrical body 58 need not be removed or replaced, saving labor and other costs associated with reconfiguring applicator 26. To facilitate installation and removal of plate 54 from body 52, a special clamping assembly 100 is provided, as illustrated in FIGS. 11 and 12. Clamping assembly 100 is mounted on a flat surface 102 of cylindrical body 52 which extends along the longitudinal extent of body 58, and includes two elongated clamping members 104a and 104b adapted for receiving longitudinal edges 106a and 106b, respectively, of plate 54. (See FIG. 13.) Each clamping member 104a and 104b includes base portion 108a and 108b, respectively as shown in FIG. 12. Base portions 108a and 108b are in spaced-apart parallel relation to one another, and are mounted to flat surface 102 for back and forth sliding movement in a direction perpendicular to the longitudinal extent of flat surface 102, as shown by arrows D and E.

As shown in FIG. 12, a pull up toggle 110 connects base portion 108a of clamping member 104a to base portion 108b of clamping member 104b. Toggle 110 includes a first elongated connecting portion 112 extending from base portion 108a, and terminating in a threaded head 114, and a second elongated connecting portion 116 extending from base portion 108b and terminating in a threaded head 118. Heads 114 and 118 are received by opposing ends of an elongated threaded nut 120. By rotating nut 120, base portions 108a and 108b can be selectively pulled closer together or pushed farther apart (in the sense of arrows D and E).

Referring to FIG. 12 each of clamping members 104a and 104b includes cover portions 122a and 122b, respectively. Each cover portion 122a, 122b is mounted to its respective base portion 108a, 108b by a lock-up bolt 124a and 124b, respectively. A registration pin 126a extends upward from flat surface 102 through base portions 108a and 108b, and is received by a well 128 in cover portion 120. When cover portion 122a is placed over base portion 108a, registration pin 126a engages the bottom 130 of well 128, preventing cover portion 122a from contacting base portion 108a in flush engagement so that a gap 132 of approximately 0.050 inches exists between portions 108a and 122a to accommodate the thickness of plate 54.

As shown in FIG. 11, clamping assembly 100 also includes second and third registration pins 126b and 126c, which are constructed in a manner substantially identical to that of registration pin 126a, and are received by wells (not shown) in cover portions 122a and 122b, respectively, which are constructed like well 128. Like pin 126a, pin 126b is located along clamping member 104a but spaced apart from pin 126a. Pin 126c is located on clamping member 104b, near the middle of plate cylinder 32, and intermediate pins 126a and 126b.

To install plate 54 onto cylindrical body 52, nut 120 of toggle 110 is rotated to push apart clamping members 104a and 104b. Lock-up bolts 106a are loosened to increase the height of gap 132. Edge 106a (as shown in FIG. 5) of plate 60 is inserted into gap 132 between cover portion 122a and base portion 108a of clamping member 104a. Registration holes 136a and 136b along edge 106a are spaced along edge 98 and correspond in position to registration pins 126a and 126b. As edge 106a is inserted into gap 132, pins 126a and 126b are inserted through holes 136a and 136b, respectively, to assure that plate 54 is properly aligned relative to body 52. Lock up bolt 124a on cover portion is then tightened to firmly engage cover portion 122a to base portion 108a, thereby securely clamping edge 106a there between.

Edge 106b of plate 54 is then inserted between cover portion 122b and base portion 108b. Edge 106b has registration hole 136c corresponding in position to registration pin 126c. As edge 106b is inserted into clamping member 104b, registration pin 126c is inserted through registration hole 136c to assure proper alignment of plate 54 on body 52. Lock up bolt 124b on cover portion 122b is then tightened to firmly engage cover portion 122b to base portion 108b, thereby securely clamping edge 138. Finally, nut 120 is rotated to pull clamping members 104a and 104b closer together, applying a lateral tension force on plate 54 to tightly and securely wrap plate 54 around cylindrical body 52.

To remove plate 54, the foregoing process is repeated in reverse. In accordance with the invention, plate 54 can be easily replaced when it has worn out, or if an alternative coating pattern is desired. This allows flexibility, quick turnaround between coating jobs and reduced labor costs.

Figure 14:
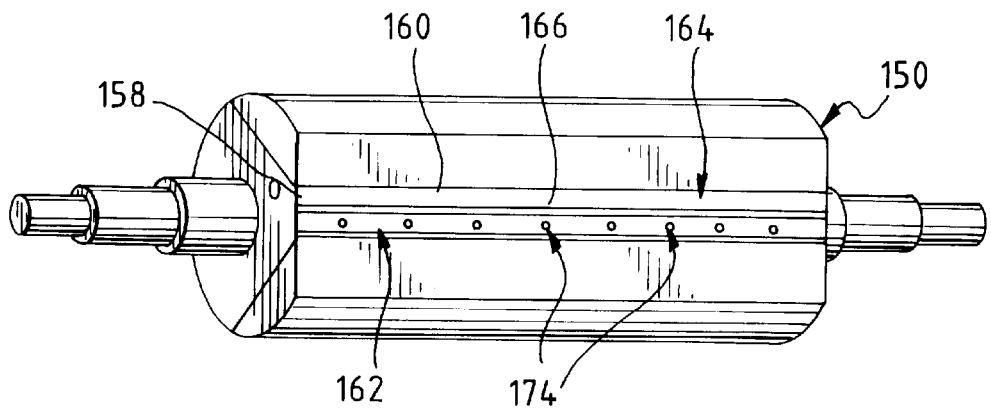
FIG. 14 is a perspective view of a plate cylinder in accordance with said second embodiment of the clamping mechanism.
Figure 15:
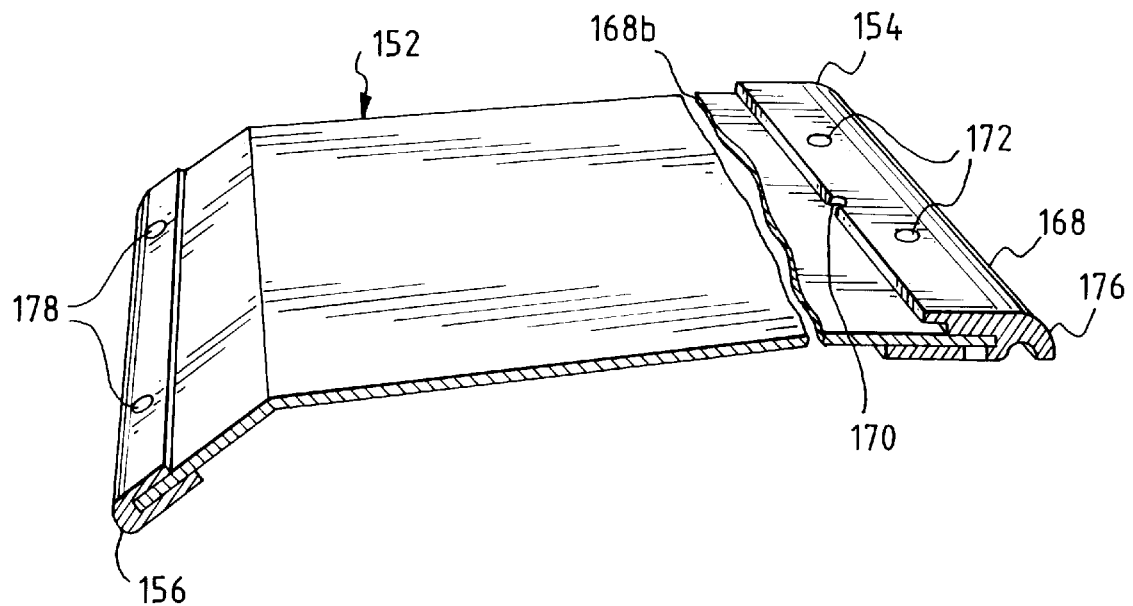
FIG. 15 is a second perspective view of the printing plate shown in FIG. 13.

Referring to FIGS. 13–15, a second embodiment of the invention is illustrated. Specifically, an alternative plate 150 and cylinder 152 are shown which are suitable for use with applicator 26 as described above. Plate 150 includes a leading end 154 and a trailing end 156, as shown in FIGS. 13 and 15.

Referring to FIG. 14, cylinder 152 includes a mounting assembly 158 having a first clamp 160 for accepting leading end 154 of plate 150 and a second clamp 162 for accepting trailing end 156 of plate 150. First clamp 160 includes a mounting bar 164 equipped with centered registration pin 166. Bar 164 is adapted for accepting in locking engagement a bar 168 which is affixed to leading edge 154. Bar 168 includes a centered notch 170 and spaced-apart registration holes 172.

To install leading edge 154, it is inserted into first clamp 160 so that registration pin 166 lines up with notch 170. Notch 168 is located along the edge 168b of bar 166 which faces trailing edge 156. In this position, plate 150 is centered in first clamp 160 of cylinder 152. Additional registration pins 174 may be provided in bar 164 of clamp 160. Holes 172 are positioned for mating alignment with pins 174, and the engagement of holes172 and pins 174 can be used to provide additional stability of the mounting of leading edge 154 in clamp 160.

Once leading edge 154 of plate 150 has been mounted, it is pulled forward and locked into position by engaging a lip 178 along the edge of bar 168. Plate 150 is then wrapped around the blanket cylinder and trailing edge 156 is inserted into second clamp 162. Clamp 162 includes registration pins (not shown) which are positioned for mating alignment with registration holes 178 located on trailing edge 156. Trailing edge 156 is secured to cylinder 152 by a conventional reel-type mechanism (not shown) included in second clamp 162. The reel mechanism is tightened to a pre-determined amount of torque, preferably 50 foot pounds.

What is claim is:

1. A coating applicator for selectively applying coating to a metallic workpiece comprising:
    (a) a plate cylinder including a cylindrical body about which a coating plate is mounted as a sleeve; said plate including a flexographic printing plate constructed of photosensitive material; wherein said plate includes a plurality of cells arranged to define a pattern corresponding to those areas of the workpiece where coating is desired;
    (b) a frame upon which said plate cylinder is rotably mounted;
    (c) said applying means disposed adjacent on said coating for applying existing material to said coating for plate cylinder;
    (d) a secondary roller that is oriented in parallel relation to said plate cylinder but is spaced-apart from said plate cylinder by a thickness slightly smaller than the thickness of the workpiece; and
    (e) feeding means for feeding the workpiece between said plate cylinder and said secondary roller, said feeding means disposed adjacent to said plate cylinder, whereby said workpiece comes into rolling engagement with said plate cylinder so that a quantity of coating material on said plate cylinder is applied to the workpiece; and wherein said plate cylinder engages the workpiece with minimal compressive force.

2. The applicator of claim 1 wherein said plate is made of flexible material and includes a leading edge and a trailing edge, and wherein said cylindrical body includes a clamping mechanism for releasable clamping said leading and trailing edges so that said plate can be removed from said cylindrical body.

3. The applicator of claim 2 wherein said clamping mechanism includes at least one registration pin and wherein at least one of said leading and trailing edges includes a registration hole located in mating alignment with said registration pin when said edge is engaged with said clamping mechanism.

4. The applicator of claim 3 wherein said pin is centered relative to the longitudinal extent of said cylindrical body and said registration hole is centered relative to the lateral extent of said plate so that said plate is also centered relative to the longitudinal extent of said cylindrical body when said plate is wrapped as a blanket around said cylinder and secured by said clamp with said pin in mating engagement with said registration hole.

5. The applicator of claim 1 wherein at least one of said cells includes a screened region defined by a grid pattern that is imposed on said cell by a photochemical reaction, said grid pattern being located on said plate in correspondence to those areas of the workpiece where higher levels of coating are desired.

6. The applicator of claim 2 wherein said clamping mechanism includes a first clamp arranged to accept said leading edge in locking engagement, said first clamp being mounted along the longitudinal extent of said cylindrical body and having a centered registration pin, wherein said leading edge includes a centered notch that is aligned with said centered registration pin when said leading edge is engaged by said first clamp.

7. The applicator of claim 6 wherein said first clamp includes two lateral registration pins disposed on opposite sides of said centered registration pin, wherein said leading edge includes registration holes that are each aligned with a different one of said lateral registration pins when said leading edge is engaged by said first clamp.

8. The applicator of claim 6 wherein said clamping mechanism includes a second clamp for engaging the trailing end of said plate, said second clamp including a reel mechanism for applying a pre-determined tension to said plate.

9. The applicator of claim 2 wherein said clamping mechanism includes at least one registration hole and wherein at least one of said leading and trailing edges includes a registration pin located in mating alignment with said registration hole when said edge is engaged by said clamping mechanism.

10. A method for selectively applying coating of a desired thickness to a metallic workpiece, comprising the steps of
   (a) preparing a flexible photosensitive plate using a photochemical reaction to impose on the plate a plurality of cells arranged to define a pattern corresponding to those areas of the workpiece where coating is desired;
   (b) imposing a screen pattern consisting of grid elements onto said plate, said screen pattern corresponding to areas of the workpiece where more coating is desired.
   (c) wrapping the plate as a sleeve around a cylindrical body, and placing said cylindrical body in spaced parallel relation to a secondary roller; wherein said cylindrical body is spaced-apart from said secondary roller;
   (d) applying coating material to the cells of said plate cylinder; and
   (e) rotating said cylindrical body and secondary roller about their respective longitudinal axis, and running a workpiece between said cylindrical body and said secondary roller wherein the workpiece comes in rolling engagement with said plate cylinder with minimal compressive force to impart onto the workpiece coating material in a pattern corresponding to said cells.

11. The method of claim 10 wherein the said step of wrapping the plate around said cylindrical body comprises the steps of using a clamping mechanism to releasably clamp at least one edge of said plate to said cylindrical body.

12. The method of claim 11 wherein said clamping step includes the step of providing a centered registration pin in said clamping mechanism and a centered notch in said edge of said plate, and aligning said notch with said pin when using said clamping mechanism to clamp said edge to said cylindrical body.

13. A method for selectively applying coating of a desired thickness to a metallic workpiece, comprising the steps of
   (a) preparing a flexible photosensitive plate using a photochemical reaction to impose on the plate a plurality of cells arranged to define a pattern corresponding to those areas of the workpiece where coating is desired;
   (b) wrapping the plate as a sleeve-like fashion around a cylindrical body, and placing said cylindrical body in spaced parallel relation to a secondary roller; wherein said cylindrical body is spaced-apart from said secondary roller by a distance slightly less than the thickness of the workpiece;
   (c) applying coating material to the cells of said plate cylinder; and
   (d) rotating said cylindrical body and secondary roller about their respective longitudinal axis, and running a workpiece between said cylindrical body and said secondary roller wherein the workpiece comes in rolling engagement with said plate cylinder with minimal compressive force to impart onto the workpiece coating material in a pattern corresponding to said cells.

14. The method of claim 13 wherein the said step of wrapping the plate around said cylindrical body comprises the steps of using a clamping mechanism to releasably clamp at least one edge of said plate to said cylindrical body.

15. The method of claim 14 wherein said clamping step includes the step of providing a centered registration pin in said clamping mechanism and a centered notch in said edge of said plate, and aligning said notch with said pin when using said clamping mechanism to clamp said edge to said cylindrical body.

16. The method of claim 13 wherein the step of preparing a flexible photosensitive plate includes the step of imposing a screen pattern consisting of grid elements onto said plate, said screen pattern corresponding to areas of the workpiece where more coating is desired.

* * * * *

UNITED STATES PATENT AND TRADEMARK OFFICE
CERTIFICATE OF CORRECTION

PATENT NO : 5,922,406
DATED : Jul. 13, 1999
INVENTOR(S): Robert E. Ludford, III

It is certified that error appears in the above-identified patent and that said Letters Patent is hereby corrected as shown below:

In Claim 1, line 13, delete "said" (first occurrence)

Signed and Sealed this

Twenty-eighth Day of December, 1999

Attest:

Q. TODD DICKINSON

*Attesting Officer*   Acting Commissioner of Patents and Trademarks